(12) United States Patent
Cala' et al.

(10) Patent No.: US 10,674,578 B1
(45) Date of Patent: Jun. 2, 2020

(54) PIPELINED EXPONENTIAL LAW BRIGHTNESS CONVERSION FOR A MULTI-CHANNEL LED DRIVER

(71) Applicant: STMicroelectronics S.r.l., Agrate Brianza (IT)

(72) Inventors: Ignazio Cala', Syracuse (IT); Salvatore Pantano, Pedara (IT); Santi Carlo Adamo, Aci Castello (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/584,059

(22) Filed: Sep. 26, 2019

(51) Int. Cl.
G06F 3/00 (2006.01)
H05B 45/10 (2020.01)
H03K 3/42 (2006.01)
H05B 47/18 (2020.01)
G06F 9/30 (2018.01)
G06F 9/38 (2018.01)

(52) U.S. Cl.
CPC ......... H05B 45/10 (2020.01); G06F 9/30098 (2013.01); H03K 3/42 (2013.01); H05B 47/18 (2020.01); G06F 9/38 (2013.01)

(58) Field of Classification Search
CPC .............................. G06F 9/30098; G06F 9/38
See application file for complete search history.

(56) References Cited

U.S. PATENT DOCUMENTS

| | | | | |
|---|---|---|---|---|
| 4,433,387 A * | 2/1984 | Dyer | ...................... | G01R 13/04 702/159 |
| 8,247,995 B2 * | 8/2012 | Wu | ........................ | H05B 45/20 315/294 |
| 9,036,657 B2 * | 5/2015 | Tomasovics | ............ | H04L 49/00 370/474 |
| 9,055,632 B2 * | 6/2015 | Tomasovics | ........... | H05B 45/37 |
| 9,609,708 B2 | 3/2017 | Williams et al. | | |
| 9,693,411 B1 | 6/2017 | Xiong et al. | | |
| 10,264,641 B1 | 4/2019 | Mays, II et al. | | |
| 2011/0068689 A1 | 3/2011 | Scenini et al. | | |
| 2017/0034886 A1 | 2/2017 | Gangi et al. | | |

OTHER PUBLICATIONS

Fong, D., David Fong's ASIC Architecture, Design, Verifications and DFT Blog, Tips and Tricks for ASIC Design, Verification and DFT, "Synchronizers for Asynchronous Signals", Jun. 8, 2014, 3 pages.

* cited by examiner

Primary Examiner — Thuy V Tran
(74) Attorney, Agent, or Firm — Slater Matsil, LLP

(57) ABSTRACT

A circuit includes: a communication interface configured to receive data; a plurality of output terminals; a bank of input registers coupled to the communication interface; a bank of buffer registers; a bank of output registers; a signal generator configured to generate a plurality of output signals based on respective registers of the bank of output registers at respective output terminals; and a conversion stage configured to: when data is received by the bank of input registers from the communication interface, sequentially convert content of the input registers of the bank of input registers and store the converted content into corresponding buffer registers of the bank of buffer registers based on a conversion function, and when the conversion stage finishes storing the converted content into the buffer registers, simultaneously copy content from the buffer registers into corresponding output registers of the bank of output registers.

20 Claims, 4 Drawing Sheets

US 10,674,578 B1

PIPELINED EXPONENTIAL LAW BRIGHTNESS CONVERSION FOR A MULTI-CHANNEL LED DRIVER

TECHNICAL FIELD

The present disclosure relates generally to an electronic system and method, and, in particular embodiments, to a pipelined exponential law brightness conversion for a multi-channel LED driver.

BACKGROUND

The use of light emitting diodes (LEDs) in lighting devices is increasing. LEDs are now common in various lighting devices, such as televisions, lamps, headlights and automotive infotainment displays, for example.

A feature commonly found in lighting devices is the dimming features. As is known, the human eye perceives brightness levels logarithmically. To make dimming appear to be even to the human eye a dimming engine changes the dimming levels in an exponential manner over time. For example, to make the change in brightness to be perceived by a human eye as a linear change, the signal controlling the LEDs, such as a pulse width modulation (PWM) signal, is changed in an exponential manner.

A conventional approach to dimming includes the use of an exponential law conversion stage that stores an exponential conversion law. The exponential law conversion stage converts linear variations in the input into exponential variations in the output. The output of the exponential law conversion stage is used to, e.g., to generate a PWM signal to drive the LEDs. The exponential law conversion stage may be implemented with a look-up table (LUT) stored in memory, for example.

In some applications, it may be desirable to use different conversion laws at different times. In such applications, a conversion stage includes multiple conversion laws, which may or may not include the exponential conversion law.

SUMMARY

In accordance with an embodiment, a circuit includes: a communication interface configured to receive data; a plurality of output terminals configured to be coupled to respective drivers; a bank of input registers coupled to the communication interface; a bank of buffer registers; a bank of output registers; a signal generator configured to generate a plurality of output signals based on respective registers of the bank of output registers at respective output terminals; and a conversion stage configured to: when data is received by the bank of input registers from the communication interface, sequentially convert content of the input registers of the bank of input registers and store the converted content into corresponding buffer registers of the bank of buffer registers based on a conversion function, and when the conversion stage finishes storing the converted content into the buffer registers, simultaneously copy content from the buffer registers into corresponding output registers of the bank of output registers.

In accordance with an embodiment, a method includes: receiving data via a communication interface; sequentially storing the received data in input registers of a bank of input registers; when data is received by the bank of input registers, sequentially converting content of the input registers and storing the converted content into corresponding buffer registers of a bank of buffer registers based on a conversion function; after storing the converted content into corresponding buffer registers, simultaneously copying content from the buffer registers into corresponding output registers of a bank of output registers; and generating driving signals based on corresponding output registers to drive corresponding light emitting diode (LED) drivers.

In accordance with an embodiment, A device including: an inter-integrated circuit ($I^2C$) interface; a bank of input registers coupled to the $I^2C$ interface, the bank of input registers including N input registers, where N is a positive integer greater than 1; a bank of buffer registers including N buffer registers; a bank of output registers including N output registers; a pulse width modulation (PWM) generator having N outputs configured to be coupled to respective light emitting diode (LED) drivers, the PWM generator configured to generate, at respective outputs of the N outputs, N PWM signals based on respective registers of the bank of output registers; and a conversion stage configured to: when data is received by the bank of input registers from the $I^2C$ interface, sequentially convert content of the N input registers and store the converted content into corresponding N buffer registers based on a conversion function, and after the conversion stage stores the converted content into the N buffer registers, simultaneously copy content from the N buffer registers into corresponding N output registers.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
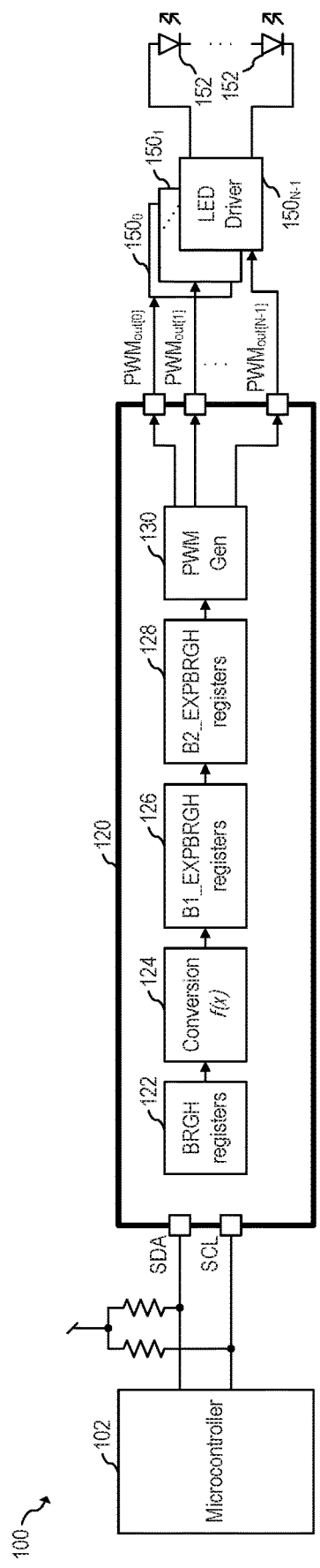
FIG. 1 shows a schematic diagram of a lighting device, according to an embodiment of the present invention.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, an exponential law brightness conversion stage for a multi-channel LED driver in specific applications and using specific communication protocols and driving schemes. Embodiments of the present invention may be used, e.g., with other conversion laws and in other applications, and using different communication protocols and driving schemes.

In an embodiment of the present invention, a plurality of LEDs are dimmed or brightened simultaneously by using a single exponential law conversion stage. Upon reception of an inter-integrated circuit (I²C) write, the exponential law conversion stage iterates through the input brightness registers and stores corresponding exponential values in first buffer registers. Once the exponential law conversion stage finishes storing the exponential values in the first buffer registers, the values of the first buffer registers are loaded in parallel into second buffer registers. A PWM generator generates a plurality of PWM signals to drive corresponding LED drivers using corresponding PWM channels based on the corresponding second buffer registers.

In some embodiments, using first buffer registers and second buffer registers in a pipelined manner advantageously allows for simultaneously updating the second buffer registers while using a single conversion stage. In some embodiments, simultaneously updating the second buffer registers advantageously avoids brightness artifacts during brightness changes of one or more of the PWM channels. Using a single conversion stage advantageously reduces device area and power consumption when compared with solutions that use a conversion stage per PWM channel.

In some multi-LED applications, simultaneously changing the brightness of the LEDs may desirable. For example, in a display of an automotive infotainment system, it may desirable to simultaneously dim or brighten the plurality backlight LEDs, e.g., to achieve a change in brightness while avoiding brightness artifacts.

FIG. 1 shows a schematic diagram of lighting device 100, according to an embodiment of the present invention. Lighting device 100 may be, for example, a backlight device for illuminating a display, such as an automotive infotainment display. Lighting device 100 includes microcontroller 102, brightness controller 120, and N LED channels, where each of the N LED channel has a respective LED driver 150 driving one or more LEDs 152. Brightness controller 120 includes input brightness registers 122, conversion stage 124, output brightness buffer registers 126, output brightness registers 128, and PWM generator 130. Each of the input brightness registers 122 corresponds to a brightness level of a corresponding LED channel.

During normal operation, microcontroller 102 writes one or more input brightness registers 122 to adjust the brightness of a corresponding LED channel.

In some embodiments, it may be desirable that changes in the values stored in the input brightness registers 122 correspond to perceived linear changes in brightness levels of the corresponding LEDs 152. For example, in some embodiments, it is desirable that, e.g., a value of 20 in a first input brightness register 122 causes the corresponding LEDs 152 to be twice as bright as when the first input brightness register 122 has a value of 10.

Since the human eye perceives brightness levels logarithmically, conversion stage 124 sequentially converts the values of each of the input brightness registers 122 using an exponential law and stores such values into output brightness buffer registers 126. Once conversion stage 124 finishes storing all converted values into output brightness buffer registers 126, the content of output brightness buffer registers 126 is copied in parallel into output brightness registers 128.

As soon as output brightness registers 128 are updated, PWM generator 130 updates output signals $PWM_{out0}$ to $PWM_{outN-1}$ based on the content of output brightness registers 128. Each $PWM_{out}$ signal drives a corresponding LED driver 150, which in turn drives one or more LEDs 152. In some embodiments, driving the LED channels in this manner advantageously allows for the LEDs 152 of each LED channel to have a perceived brightness that changes linearly with the content of the corresponding input brightness register 122.

LED drivers 150 may be implemented in any way known in the art. For example, in some embodiments, LED drivers 150 are implemented as a current controlled LED driver. Other implementations are also possible.

PWM generator 130 may be implemented in any way known in the art. For example, in some embodiments, PWM generator is implemented with a comparator per LED channel, where each of the comparators has an input receiving a sawtooth signal, a second input receiving a voltage (e.g., proportional to the content of the corresponding register 128), and an output that produce a PWM signal that has a duty cycle proportional to the voltage of the second input of the comparator. Other implementations are also possible.

In some embodiments, conversion stage 124 may be implemented with a finite state machine (FSM). In some embodiments, conversion stage 124 may be implemented with a look-up table. Other implementations are also possible.

In some embodiments, conversion stage 124 may implement an exponential conversion law. For example, in some embodiments, conversion stage 124 converts an input x into an output y according to an exponential conversion law given by:

$$y=ae^{bx}+c \quad (1)$$

where a, b and c are coefficients that are real numbers. For example, in an embodiment, the exponential conversion law is given by $$y=(0.961e^{255-x})\cdot 100 \quad (2)$$

where x is the content of an 8-bit input brightness register of the input brightness registers 122 that goes from decimal 0 to decimal 255.

In some embodiments, a natural exponential function, such as shown in Equations 1 and 2, may be used. In some embodiments, a different exponential conversion law may be implemented. In some embodiments, a different conversion law (e.g., a non-exponential conversion law) may be used.

Registers 122, 126 and 130 may be implemented in any way known in the art, such as by using flip-flops. Each of the registers 122, 126, and 128, may be, for example, an 8-bit, 16-bit, 32-bit, 64-bit registers. Other values, such as 4-bit registers, 10-bit registers, 15-bit, 50-bit, 65-bit or more are also possible. In some embodiments, the register size of each of the registers 122, 126 and 128 are all the same. In other embodiments, the register size of the registers 122, 126, and 128, are different. For example, in other embodiments, the register size of registers 122 may be different (e.g., smaller) than the register size of registers 126 and 128. Other implementations are also possible.

Microcontroller 102 may be implemented as a general purpose processor, controller or digital signal processor (DSP) that includes, for example, combinatorial circuits coupled to a memory. In some embodiments, microcontroller 102 may be implemented as a custom application specific integrated circuit (ASIC). Other implementations are also possible.

In some embodiments, e.g., as shown in FIG. 1, microcontroller 102 communicates with brightness controller 120 using $I^2C$. Other communication protocols, such as serial peripheral interface (SPI), may also be used.

In some embodiments, brightness controller 120 may be implemented in a monolithic semiconductor substrate of an integrated circuit. In some embodiments, such integrated circuit may also include the LED drivers 150. In other embodiments, the LED drivers 150 are implemented outside the integrated circuit that includes the brightness controller 120. Other implementations are also possible.

Figure 2:
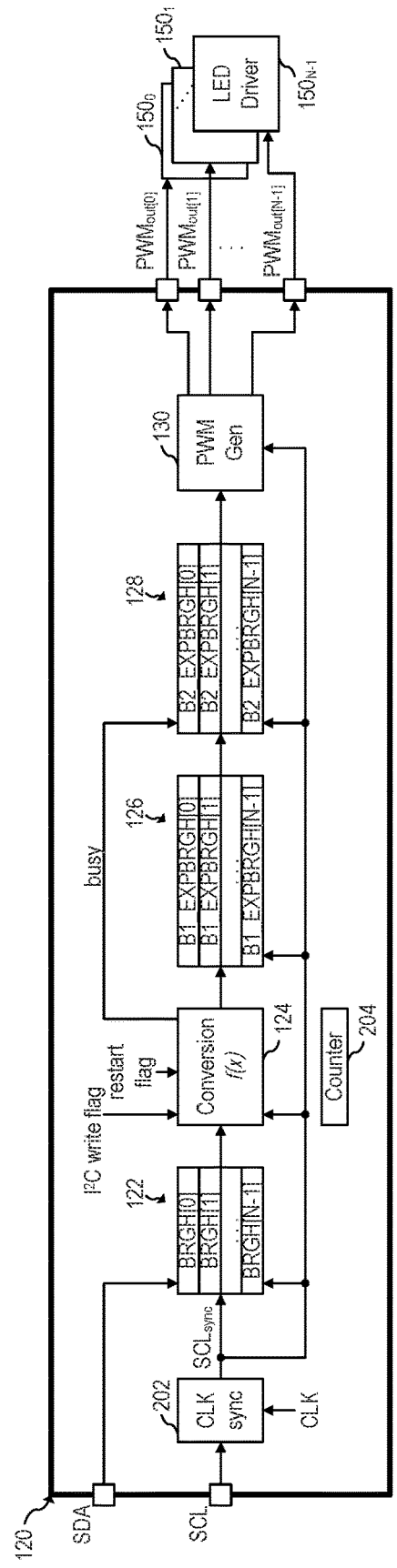
FIG. 2 shows a schematic diagram of the brightness controller of FIG. 1, according to an embodiment of the present invention.

FIG. 2 shows a schematic diagram of brightness controller 120, according to an embodiment of the present invention. As shown in FIG. 2, clock synchronization circuit 202 is an internal circuit used to synchronize external $I^2C$ clock SCL to internal clock CLK. The synchronized clock $SCL_{sync}$ is used to clock registers 122, 126 and 128, and to store in registers 122, 126, and 128 data from the $I^2C$ bus. The synchronized clock $SCL_{sync}$ is also used to clock conversion stage 124 and PWM generator 130.

During normal operation, when microcontroller 102 performs a write operation into input brightness registers 122, $I^2C$ write flag is asserted. When the $I^2C$ write flag is asserted, conversion stage 124 begins to sequentially convert (e.g., using counter 204) the content of each input BRGH[i] register of the input brightness registers 122 and to store the converted values into the corresponding B1_EXPBRGH[i] register of the output brightness buffer registers 126. During conversion and storage, a busy signal is asserted. Once conversion stage 124 finishes storing all of the converted values, the busy signal is deasserted.

When the busy signal is deasserted, the content of each of the B1_EXPBRGH[i] register is copied, in parallel, into the corresponding B2_EXPBRGH[i] register of the output brightness registers 128. The duty cycle of each of $PWM_{out}$ [i] is based on the corresponding B2_EXPBRGH[i] register.

In some embodiments, microcontroller 102 performs a burst write, in which all of the input brightness registers 122 (BRGH[0] to BRGH[N−1]) are sequentially written. In some embodiments, a single BRGH[i] register or a subset of the input brightness registers 122 may be written.

In some embodiments, when microcontroller 102 writes a BRGH[z] register while the busy signal is asserted, a check is performed to see whether the conversion stage 124 has already converted the content of such BRGH[z] register (e.g., by comparing z with an internal count of counter 204). If conversion stage 124 has not already converted BRGH[z] register, then conversion stage 124 continues to sequentially convert the content of each of the BRGH registers, including the new content of BRGH[z] register. However, if conversion stage 124 has already converted BRGH[z], then a restart flag is asserted.

When the restart flag is asserted, once conversion stage 124 finishes converting all of the BRGH registers (e.g., when the count of counter 204 reaches N−1), then the count of counter 204 is restarted at value z and conversion stage 124 begins again to sequentially convert the BRGH registers beginning on BRGH[z] and ending in register BRGH[N−1].

In some embodiments, N is a positive integer greater than 1, such as 2, 4, 8, 10, 12, 15, 21, or more.

Clock synchronization circuit 202 receives $I^2C$ clock SCL, internal clock CLK, and generates a synchronized clock $SCL_{sync}$. The generated synchronized clock $SCL_{sync}$ has the same frequency as the internal clock CLK. Clock synchronization circuit 202 may be implemented in any way known in the art. For example, in some embodiments, clock synchronization circuit 202 is implemented as a double stage of flip-flops connected in a cascade manner. Other implementations are also possible.

In some embodiments, the frequency of synchronized clock $SCL_{sync}$ is equal to or higher than twice the frequency of $I^2C$ clock SCL. For example, in some embodiments, the frequency of synchronized clock $SCL_{sync}$ is four times higher than the frequency of the $I^2C$ clock SCL.

Counter 204 is configured to count, e.g., from 0 to N, e.g., based on the synchronized clock $SCL_{sync}$. Counter 204 may be implemented in any way known in the art. For example, in some embodiments, counter 204 may be implemented as a count-up or count-down counter that increments/decrements the internal count by one on, e.g., each clock cycle of synchronized clock $SCL_{sync}$. Other implementations are also possible.

Figure 3:
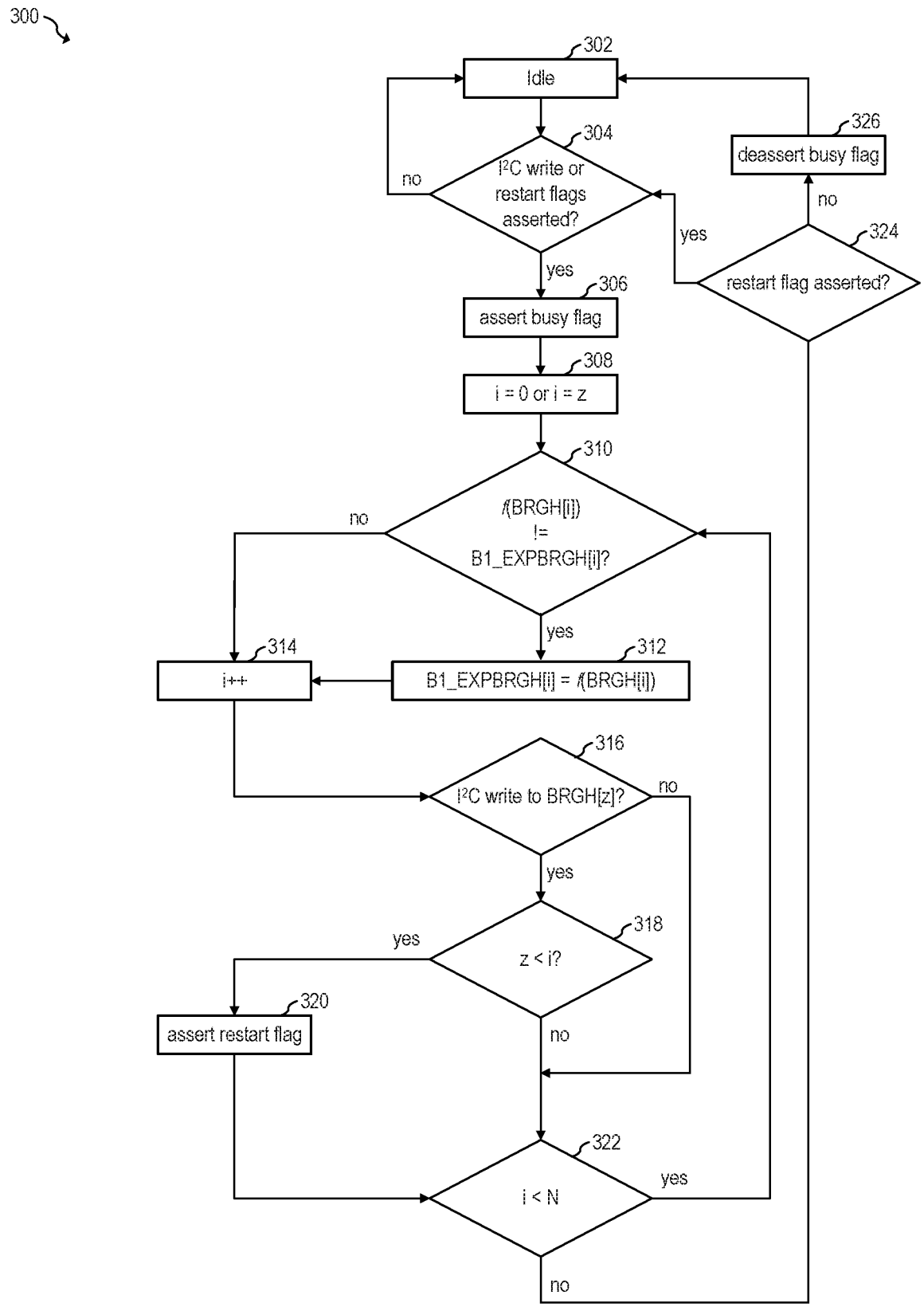
FIG. 3 shows a flow chart of an embodiment method for converting an input brightness value into an output brightness value, according to an embodiment of the present invention.

FIG. 3 shows a flow chart of embodiment method 300 for converting an input brightness value into an output brightness value, according to an embodiment of the present invention. FIG. 3 may be understood in view of FIG. 2.

During step 302, conversion stage 124 is idle. When the $I^2C$ write flag is asserted (e.g., because microcontroller 102 performed an I2C write) during step 304 or when the restart signal is asserted during step 304, then the busy flag is asserted during step 306 (if the busy flag is already asserted during step 306, then asserting the busy flag causes the busy flag to remain asserted). During step 308, if the restart signal is asserted, the counter value i, e.g., of counter 204, is set to z. If the restart signal is not asserted during step 308, then the counter value i is set to 0.

During step 310, conversion stage 124 converts the content of BRGH[i] register of the input brightness registers 122 and compares the converted output with the content of B1_EXPBRGH[i] register of the output brightness buffer registers 126. If the values are the same, the counter is incremented during step 314 and step 316 is then performed. If the values are different, then the converted value f(BRGH[i]) is stored in the B1_EXPBRGH[i] register during step 312 before incrementing the counter during step 314.

In some embodiments, step 310 may be omitted, and step 312 may be performed after step 308, with step 314 following step 312.

During step 316, it is determined whether the BRGH[z] register has been written, where z is an integer between 0 and N−1, inclusive. If no, then step 322 is performed, if yes, then z is compared with i during step 318. If z is smaller than i, then the restart flag is asserted during step 320 and step 322 is performed after step 320. If z is not smaller than i, then step 322 is performed without performing step 320.

During step 322, i is compared with N to determine whether conversion stage has converted all of the N input brightness registers 122. If i is lower than N during step 322, then step 310 is performed. If not, then step 324 is performed.

During step 324, it is determined if the restart flag is asserted. If yes, then step 304 is performed. If not, then the busy flag is deasserted during step 326, and the conversion stage 124 returns to the idle stage during step 302.

Figure 4:
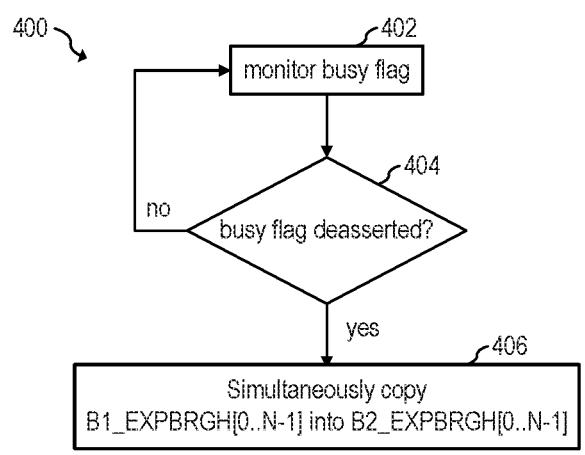
FIG. 4 shows a flow chart of an embodiment method 400 for updating the output brightness registers of FIG. 2, according to an embodiment of the present invention.

FIG. 4 shows a flow chart of embodiment method 400 for updating output brightness registers 128, according to an embodiment of the present invention. FIG. 4 may be understood in view of FIG. 2.

During step 402, brightness controller 120 monitors the state of the busy flag. During step 404, it is determined whether the busy flag has transitioned from an asserted state into a deasserted stage. If yes (e.g., if step 326 was performed), then the content of each of the B1_EXPBRGH registers is copied into the corresponding B2_EXPBRGH registers during step 406.

Figure 5:
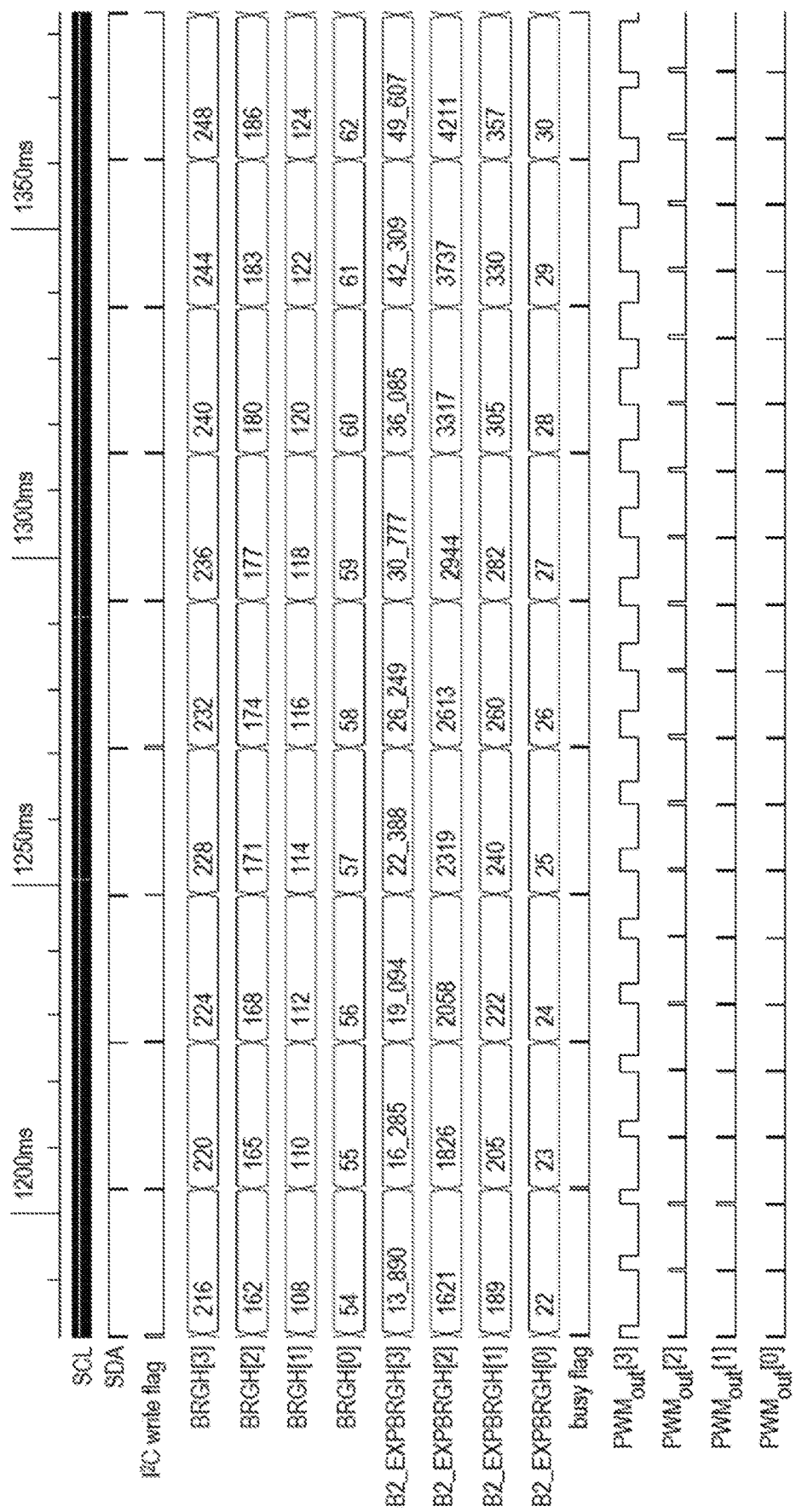
FIG. 5 shows simulations results illustrating signals of the brightness controller of FIG. 2 in an application having four LED channels, according to an embodiment of the present invention.

FIG. 5 shows simulations results illustrating signals of brightness controller 120 in an application having four LED channels (N=4), according to an embodiment of the present invention.

As shown in FIG. 5, when an I²C write is performed into the BRGH registers, the I²C write flag is asserted. When the I²C write flag is asserted, the busy flag is asserted and the content of the BRGH registers is sequentially converted using the exponential conversion law. When the busy flag is deasserted the converted content is loaded, in parallel, into corresponding B2_EXPBRGH registers. After the B2_EXPBRGH registers are updated, PWM generator 130 processes the updated content of the B2_EXPBRGH registers to generate an updated $PWM_{out}$ signal for each LED channel (e.g., with an updated on time and duty cycle).

Example embodiments of the present invention are summarized here. Other embodiments can also be understood from the entirety of the specification and the claims filed herein.

Example 1

A circuit including: a communication interface configured to receive data; a plurality of output terminals configured to be coupled to respective drivers; a bank of input registers coupled to the communication interface; a bank of buffer registers; a bank of output registers; a signal generator configured to generate a plurality of output signals based on respective registers of the bank of output registers at respective output terminals; and a conversion stage configured to: when data is received by the bank of input registers from the communication interface, sequentially convert content of the input registers of the bank of input registers and store the converted content into corresponding buffer registers of the bank of buffer registers based on a conversion function, and when the conversion stage finishes storing the converted content into the buffer registers, simultaneously copy content from the buffer registers into corresponding output registers of the bank of output registers.

Example 2

The circuit of example 1, where the communication interface is an inter-integrated circuit (I²C) interface.

Example 3

The circuit of one of examples 1 or 2, where the communication interface is further configured to receive a first clock, and where the bank of input registers is configured to receive a second clock that is synchronized with the first clock, where the first clock has a first frequency, the second clock has a second frequency, and where the second frequency is higher than the first frequency.

Example 4

The circuit of one of examples 1 to 3, where the second frequency equal to or higher than twice the first frequency.

Example 5

The circuit of one of examples 1 to 4, where the signal generator is a pulse width modulation pulse width modulation (PWM) generator.

Example 6

The circuit of one of examples 1 to 5, where the conversion stage includes a finite state machine (FSM).

Example 7

The circuit of one of examples 1 to 6, where the conversion function is an exponential function.

Example 8

The circuit of one of examples 1 to 7, where the exponential function is a natural exponential function.

Example 9

The circuit of one of examples 1 to 8, where the conversion stage is configured to: assert a busy flag when beginning to sequentially convert content of the input registers; and deassert the busy flag when the sequential conversion finishes.

Example 10

The circuit of one of examples 1 to 9, where the conversion stage is configured to simultaneously copy content from the buffer registers into corresponding output registers when the busy flag is deasserted.

Example 11

The circuit of one of examples 1 to 10, where the conversion stage is configured to sequentially convert content of the input registers by sequentially incrementing a count value, the conversion stage further configured to: when data is received by a given input register associated to a given count value while the busy flag is asserted, assert a restart flag if the given count value is lower than the count value when the given input register is written; and restart sequentially converting content of the input registers by setting the count value at the given count value.

Example 12

A method including: receiving data via a communication interface; sequentially storing the received data in input registers of a bank of input registers; when data is received by the bank of input registers, sequentially converting content of the input registers and storing the converted content into corresponding buffer registers of a bank of buffer registers based on a conversion function; after storing the converted content into corresponding buffer registers, simultaneously copying content from the buffer registers into corresponding output registers of a bank of output registers; and generating driving signals based on corresponding output registers to drive corresponding light emitting diode (LED) drivers.

Example 13

The method of example 12, where the driving signals are pulse width modulation (PWM) driving signals.

Example 14

The method of one of examples 12 or 13, where the conversion function is a natural exponential function.

Example 15

The method of one of examples 12 to 14, further including: asserting a busy flag when beginning to sequentially convert content of the input registers; and deasserting the busy flag after storing the converted content into the buffer registers, where simultaneously copying content from the buffer registers into the output registers includes simultaneously copying content from the buffer registers into the output registers when the busy flag transitions from an asserted state into a deasserted state.

Example 16

The method of one of examples 12 to 15, further including, while sequentially converting content of the input registers: converting content of a given register of the bank of input registers; after converting content of the given register, receiving new data at the given register from the communication interface; and after receiving new data at the given register, converting new content of the given register, where the new content of the given register is based on the new data.

Example 17

A device including: an inter-integrated circuit (I²C) interface; a bank of input registers coupled to the I²C interface, the bank of input registers including N input registers, where N is a positive integer greater than 1; a bank of buffer registers including N buffer registers; a bank of output registers including N output registers; a pulse width modulation (PWM) generator having N outputs configured to be coupled to respective light emitting diode (LED) drivers, the PWM generator configured to generate, at respective outputs of the N outputs, N PWM signals based on respective registers of the bank of output registers; and a conversion stage configured to: when data is received by the bank of input registers from the I²C interface, sequentially convert content of the N input registers and store the converted content into corresponding N buffer registers based on a conversion function, and after the conversion stage stores the converted content into the N buffer registers, simultaneously copy content from the N buffer registers into corresponding N output registers.

Example 18

The device of example 17, further including N LED drivers, where each of the N LED drivers includes an input coupled to a respective output of the N outputs of the PWM generator.

Example 19

The device of one of examples 17 or 18, where a busy signal is asserted when the conversion stage is sequentially converting content of the N input registers, and where the conversion stage is configured to: convert content of a given register of the N input registers while sequentially converting content of the N input registers; and when new data is received at the given registers from the I²C interface after the conversion stage converts the content of the given register, convert new content of the given register before the busy signal is deasserted, where the new content is based on the new data.

Example 20

The device of one of examples 17 to 19, where N is greater than or equal to 4.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a communication interface configured to receive data;
   a plurality of output terminals configured to be coupled to respective drivers;
   a bank of input registers coupled to the communication interface;
   a bank of buffer registers;
   a bank of output registers;
   a signal generator configured to generate a plurality of output signals based on respective registers of the bank of output registers at respective output terminals; and
   a conversion stage configured to:
      when data is received by the bank of input registers from the communication interface, sequentially convert content of the input registers of the bank of input registers and store the converted content into corresponding buffer registers of the bank of buffer registers based on a conversion function, and
      when the conversion stage finishes storing the converted content into the buffer registers, simultaneously copy content from the buffer registers into corresponding output registers of the bank of output registers.

2. The circuit of claim 1, wherein the communication interface is an inter-integrated circuit (I²C) interface.

3. The circuit of claim 1, wherein the communication interface is further configured to receive a first clock, and wherein the bank of input registers is configured to receive a second clock that is synchronized with the first clock, wherein the first clock has a first frequency, the second clock has a second frequency, and wherein the second frequency is higher than the first frequency.

4. The circuit of claim 3, wherein the second frequency equal to or higher than twice the first frequency.

5. The circuit of claim 1, wherein the signal generator is a pulse width modulation pulse width modulation (PWM) generator.

6. The circuit of claim 1, wherein the conversion stage comprises a finite state machine (FSM).

7. The circuit of claim 1, wherein the conversion function is an exponential function.

8. The circuit of claim 7, wherein the exponential function is a natural exponential function.

9. The circuit of claim 1, wherein the conversion stage is configured to:
assert a busy flag when beginning to sequentially convert content of the input registers; and
deassert the busy flag when the sequential conversion finishes.

10. The circuit of claim 9, wherein the conversion stage is configured to simultaneously copy content from the buffer registers into corresponding output registers when the busy flag is deasserted.

11. The circuit of claim 9, wherein the conversion stage is configured to sequentially convert content of the input registers by sequentially incrementing a count value, the conversion stage further configured to:
when data is received by a given input register associated to a given count value while the busy flag is asserted, assert a restart flag if the given count value is lower than the count value when the given input register is written; and
restart sequentially converting content of the input registers by setting the count value at the given count value.

12. A method comprising:
receiving data via a communication interface;
sequentially storing the received data in input registers of a bank of input registers;
when data is received by the bank of input registers, sequentially converting content of the input registers and storing the converted content into corresponding buffer registers of a bank of buffer registers based on a conversion function;
after storing the converted content into corresponding buffer registers, simultaneously copying content from the buffer registers into corresponding output registers of a bank of output registers; and
generating driving signals based on corresponding output registers to drive corresponding light emitting diode (LED) drivers.

13. The method of claim 12, wherein the driving signals are pulse width modulation (PWM) driving signals.

14. The method of claim 12, wherein the conversion function is a natural exponential function.

15. The method of claim 12, further comprising:
asserting a busy flag when beginning to sequentially convert content of the input registers; and
deasserting the busy flag after storing the converted content into the buffer registers, wherein simultaneously copying content from the buffer registers into the output registers comprises simultaneously copying content from the buffer registers into the output registers when the busy flag transitions from an asserted state into a deasserted state.

16. The method of claim 12, further comprising, while sequentially converting content of the input registers:
converting content of a given register of the bank of input registers;
after converting content of the given register, receiving new data at the given register from the communication interface; and
after receiving new data at the given register, converting new content of the given register, wherein the new content of the given register is based on the new data.

17. A device comprising:
an inter-integrated circuit (I²C) interface;
a bank of input registers coupled to the I²C interface, the bank of input registers comprising N input registers, wherein N is a positive integer greater than 1;
a bank of buffer registers comprising N buffer registers;
a bank of output registers comprising N output registers;
a pulse width modulation (PWM) generator having N outputs configured to be coupled to respective light emitting diode (LED) drivers, the PWM generator configured to generate, at respective outputs of the N outputs, N PWM signals based on respective registers of the bank of output registers; and
a conversion stage configured to:
when data is received by the bank of input registers from the I²C interface, sequentially convert content of the N input registers and store the converted content into corresponding N buffer registers based on a conversion function, and
after the conversion stage stores the converted content into the N buffer registers, simultaneously copy content from the N buffer registers into corresponding N output registers.

18. The device of claim 17, further comprising N LED drivers, wherein each of the N LED drivers comprises an input coupled to a respective output of the N outputs of the PWM generator.

19. The device of claim 17, wherein a busy signal is asserted when the conversion stage is sequentially converting content of the N input registers, and wherein the conversion stage is configured to:
convert content of a given register of the N input registers while sequentially converting content of the N input registers; and
when new data is received at the given registers from the I²C interface after the conversion stage converts the content of the given register, convert new content of the given register before the busy signal is deasserted, wherein the new content is based on the new data.

20. The device of claim 17, wherein N is greater than or equal to 4.

* * * * *